United States Patent [19]

Bristol

[11] Patent Number: 4,575,661
[45] Date of Patent: Mar. 11, 1986

[54] MULTIPLEXED DISPLAY INTERFERENCE COMPENSATOR

[75] Inventor: Lloyd R. Bristol, Tigard, Oreg.

[73] Assignee: Tektronix, Inc., Beaverton, Oreg.

[21] Appl. No.: 464,289

[22] Filed: Feb. 7, 1983

[51] Int. Cl.⁴ .................................. H01J 29/52
[52] U.S. Cl. .................................. 315/383; 315/392
[58] Field of Search .................. 315/383, 385, 392; 340/721, 442; 128/712

[56] References Cited

U.S. PATENT DOCUMENTS

| 3,667,287 | 6/1972 | Furon | 315/385 |
| 3,946,275 | 3/1976 | Marino | 315/383 |
| 4,094,310 | 6/1978 | McEachern et al. | 128/712 |

Primary Examiner—Theodore M. Blum
Attorney, Agent, or Firm—George T. Noe; John P. Dellett

[57] ABSTRACT

A multiplexed display interference compensation system for minimizing the apparent intensity modulation of an oscilloscope waveform display caused by closely spaced, individually imperceptible interruptions of the waveform required to maintain refreshed readout display is provided. The system includes a charge pump circuit for adding a current pulse to a waveform intensity control signal in response to a control signal from display multiplex control so as to increase the waveform intensity just after the interruption.

6 Claims, 3 Drawing Figures

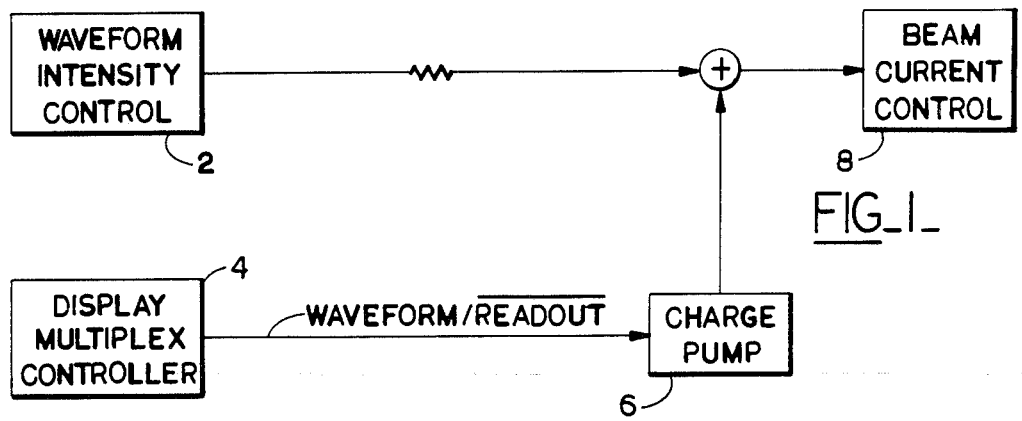
FIG_1_
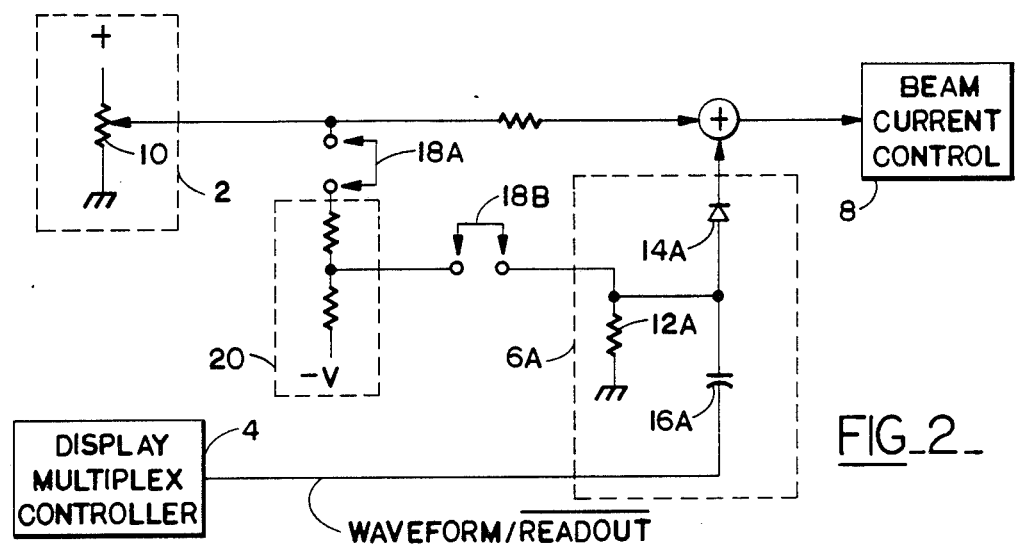
FIG_2_
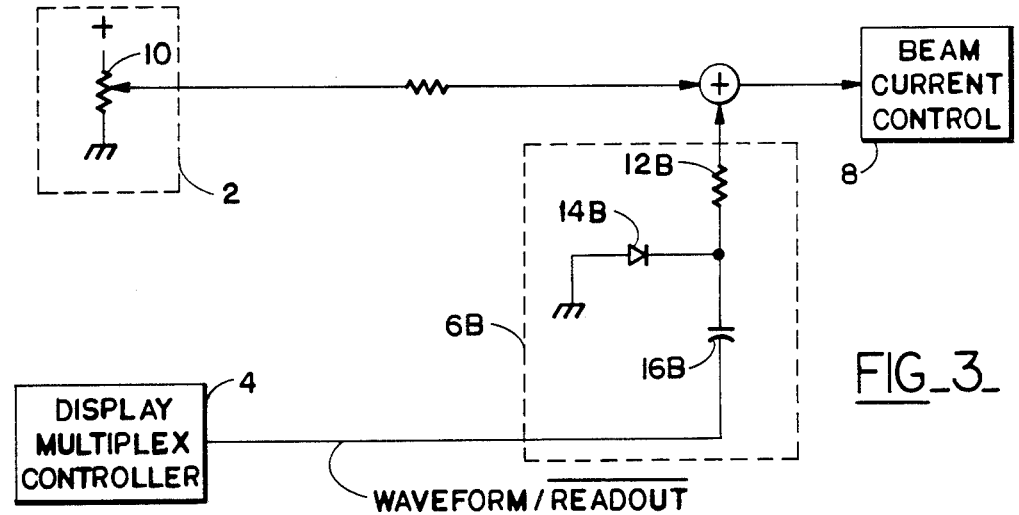
FIG_3_

MULTIPLEXED DISPLAY INTERFERENCE COMPENSATOR

BACKGROUND OF THE INVENTION

The present invention relates generally to an electronic waveform display system, and more particularly to one having a secondary or readout display function.

The readout provides an alphanumeric display to provide an operator with various information such as parameter settings, operation status, measurement results, etc. using LED, LCD devices or a cathode ray tube (CRT) in an electronic waveform display system such as an oscilloscope.

The present invention is directed to an improvement of the type wherein a CRT is commonly used for the secondary or readout display along with waveform display. In such a waveform display system, the readout is usually displayed on upper and lower portions of the CRT screen in order to not disturb the displayed waveforms. Also, an electron beam of the CRT is used for both waveform and readout display in a time sharing manner.

Ideally, readout information should be displayed only when the system is not displaying waveform traces, in order not to interfere with the waveform display. The readout occurs before a trace commences, after a trace is completed, or between consecutive traces. Refreshing the readout within such periods causes no interference with the displayed waveforms.

However, such a technique is not effective over the entire sweep rate range of the waveform. Flicker of the readout display occurs at lower sweep rates. Also, the period between the consecutive traces may be insufficient to finish the readout display at very high sweep rates. Accordingly, momentary interruptions of the waveform are needed at such sweep rates to maintain the readout display flicker-free and at a constant intensity. As a result, intensity modulation of the waveform display is apparent at moderate sweep rates, caused by closely spaced, individually imperceptible interruptions.

SUMMARY OF THE INVENTION

In accordance with the present invention, a charge pump circuit responsive to a control signal from a display multiplex controller is provided to add current pulses to a waveform intensity control signal, thereby increasing the waveform intensity immediately after refreshing each dot in a readout display. Thus, the apparent waveform intensity modulation due to the interruptions is effectively minimized to improve display quality.

It is therefore one object of the present invention to provide a means for improving display quality in the waveform display system wherein the waveform trace is interrupted.

It is another object of the present invention to provide a multiplexed display interference compensator composed of very simple circuits.

It is a further object of the present invention to provide a multiplexed display interference compensator easily applicable to an existing waveform display system.

Other objects and advantages will become apparent to those skilled in the art upon a reading of the following description when taken in conjunction with the accompanying drawings.

BRIEF DESCRIPTION OF THE DRAWINGS

FIG. 1 is a simplified block diagram for explaining the principle of the present invention;

FIG. 2 shows one embodiment of the multiplexed display interference compensator according to the present invention; and FIG. 3 shows another embodiment of the multiplexed display interference compensator according to the present invention.

DETAILED DESCRIPTION OF THE INVENTION

Referring to FIG. 1, a waveform intensity control circuit 2, a display multiplex controller 4, a charge pump 6, and beam current control circuit 8 are included in a waveform display system. Charge pump circuit 6 itself is well known prior art. Waveform intensity control circuit 2, commonly known as a Z-axis amplifier, generates an analog control signal to determine the intensity of the displayed waveform. Display multiplex controller 4 controls switching of various display modes. A WAVEFORM/READOUT signal is one output of display multiplex controller 4. This is a control signal applied to the rest (not shown) of the waveform display system to switch the display mode between waveform and readout in such a manner that the CRT beam is directed to the waveform while the signal is at a high state and the beam is diverted to readout display locations while the signal is at a low state. The WAVEFORM/READOUT signal is usually at the high state when the waveform is to be traced. However, in the above-mentioned cases in which readout display refreshing is required in the waveform tracing period, the WAVEFORM/READOUT signal periodically goes negative to refresh one dot of alphanumeric display each time. Charge pump circuit 6 receives the WAVEFORM/READOUT signal and generates current pulses to be added to the waveform intensity control signal from waveform intensity control circuit 2 each time the display is switched from the readout display to the waveform display mode. The composite waveform intensity signal or the compensation waveform intensity signal is applied to beam current conrol circuit 8 to increase the CRT beam current immediately following the refreshing of each dot in a readout display. Thus, apparent intensity modulation of the waveform display caused by interruptions of the waveform is reduced.

FIG. 2 shows one embodiment of the multiplexed interference compensator in accordance with the present invention. Waveform intensity control circuit 2 is represented by a potentiometer 10 operating between ground and a suitable positive voltage. Charge pump circuit 6A comprises resistor 12A, diode 14A and capacitor 16A. One end of capacitor 16A receives the WAVEFORM/READOUT signal output, and the other end thereof is connected to one end of resistor 12A and the anode of diode 14A. The other end of resistor 12A is grounded and the cathode of diode 14A acts as an output terminal of charge pump circuit 6A. The output of charge pump circuit 6A is a current pulse generated each time the WAVEFORM/READOUT signal changes from the low state to the high state. Capacitor 16A and resistor 12A in charge pump circuit 6A are chosen to maintain the average CRT beam current directed to the waveform display, taking the secondary display diversion time, the WAVEFORM/READOUT signal amplitude, and the waveform intensity control level into account. The desired relationships can be maintained with various settings of the waveform intensity conrol circuit 2 by an appropriately non-linear transfer function in beam current control circuit 8 or by adjusting the return voltage of resistor 12, the amplitude of the WAVEFORM/READOUT signal or other equivalent means.

Alternatively, optional jumpers 18A and 18B may be utilized to connect a voltage divider 20 into the circuit in series between the waveform intensity control circuit 2 and the junction of diode 14A and capacitor 16A to vary the fraction of the WAVEFORM/READOUT signal effectively applied to the charge pump 6A according to the setting of the waveform intensity control setting such that the effect of the current pulses can be made approximately proportional to the CRT beam current at all settings.

Referring now to FIG. 3, there is shown another embodiment of the multiplexed display interference compensator in accordance with the present invention. This is similar to the configuration of the embodiment shown in FIG. 2 except that another type of charge pump circuit 6B is used. In charge pump circuit 6B, one end of capacitor 16B receives the WAVEFORM/READOUT signal and the other end of capacitor 16B is connected to cathode of diode 14B and one end of resistor 12B. The anode of diode 14B is grounded and the other end of resistor 12B acts as an output terminal of charge pump circuit 16B. Similarly, charge pump circuit 6B generates a current pulse each time the WAVEFORM/READOUT signal changes from the low state to the high state to produce a composite waveform intensity signal, thus minimizing the apparent intensity modulation of the waveform.

According to the present invention, the waveform intensity modulation due to interruptions of the waveform is effectively minimized to improve display quality. The multiplexed display compensator is very simple and easily applicable to an existing waveform display system.

While there has been shown and described the preferred embodiments of the present invention, it will be apparent to those skilled in the are that many changes and modifications can be made without departing from the spirit of the present invention. Consequently, the scope of this invention should be interpreted only by the appended claims.

What I claim as being novel is:

1. A multiplexed display interference compensator for minimizing apparent waveform intensity modulation due to imperceptibly short interruptions of the waveform display on a cathode ray tube in a waveform display system wherein a beam is temporarily diverted to a secondary display segment on the screen of the cathode ray tube within a waveform displaying period in response to a control signal from display multiplex control means, the compensator comprising means for adding a current pulse to a waveform intensity control signal in response to the conrol signal from said display multiplex control means, to increase the intensity of a portion of the waveform display near each interrupted portion thereof.

2. A multiplexed display interference compensator in accordance with claim 1 wherein said current pulse adding means includes a charge pump circuit.

3. A multiplexed display interference compensator in accordance with claim 1 wherein said waveform intensity control signal is an analog signal from a potentiometer connected between two different voltages.

4. A multiplexed display interference compensator in accordance with claim 1 wherein the control signal from said display multiplex control means has a first predetermined voltage state to select the waveform display and a second predetermined voltage state to select the secondary display.

5. A multiplexed display interference compensator in accordance with claim 1 where said intensity control signal is applied to a CRT beam current control system including an amplifier with an approximately exponential transfer function such that the current pulse produces the same compensation effect for all CRT beam currents.

6. A multiplexed display interference compensator in accordance with claim 1 wherein the magnitude of the current pulse is adjusted according to the beam current in such a manner that the current pulse produces approximately the same proportional compensation effect for all CRT beam currents.

* * * * *